US006727598B2

(12) United States Patent
Choa

(10) Patent No.: US 6,727,598 B2
(45) Date of Patent: Apr. 27, 2004

(54) THERMALLY TUNABLE SYSTEM

(75) Inventor: Fow-Sen Choa, Baltimore, MD (US)

(73) Assignee: University of Maryland, Baltimore County, Baltimore, MD (US)

( * ) Notice: Subject to any disclaimer, the term of this patent is extended or adjusted under 35 U.S.C. 154(b) by 0 days.

(21) Appl. No.: 10/143,817

(22) Filed: May 14, 2002

(65) Prior Publication Data

US 2003/0006225 A1 Jan. 9, 2003

Related U.S. Application Data

(60) Provisional application No. 60/290,748, filed on May 14, 2001.

(51) Int. Cl.$^7$ ............................................. H01L 23/28
(52) U.S. Cl. ..................... 257/796; 257/720; 372/34; 372/102; 219/210; 385/20; 385/27; 385/50
(58) Field of Search ................. 257/81, 99, 177–181, 257/584, 625, 675, 688, 705–707, 712–722, 796, 689, 48, 49; 438/22, 24, 117, 122–127; 219/210; 385/20, 27, 50; 372/34, 102, 20, 32, 94, 36, 129

(56) References Cited

U.S. PATENT DOCUMENTS

| | | | | |
|---|---|---|---|---|
| 4,286,232 A | * | 8/1981 | Puech et al. .................... | 372/43 |
| 5,022,730 A | * | 6/1991 | Cimini et al. .................. | 385/27 |
| 5,325,392 A | * | 6/1994 | Tohmori et al. ............... | 372/96 |
| 5,642,371 A | | 6/1997 | Tohyama et al. | |
| 5,717,712 A | * | 2/1998 | Swaminathan et al. ...... | 372/107 |
| 6,332,322 B1 | | 12/2001 | Tanaka | |

OTHER PUBLICATIONS

S. L. Woodward et al. "A DBR Laser Tunable by Resistive Heating", IEEE Photonics Technology Letters, vol. 4, No. 12, Dec. 1992, pp. 1330–1332.
Shinji Sakano et al. "Tunable DFB Laser with a Striped Thin–Film Heater", IEEE Photonics Technology Letters, vol. 4, No. 4, Apr. 1992, pp. 321–323.
Hiroyuki Ishii et al., "Narrow Spectral Linewidth Under Wavelength Tuning in Thermally Tunable Super–Structure–Grating (SSG) DBR Lasers", IEEE Journal of Selected Topics In Quantum Electronics, vol. 1, No. 2, Jun. 1995, pp. 401–407.

* cited by examiner

Primary Examiner—David Nelms
Assistant Examiner—Long Tran
(74) Attorney, Agent, or Firm—Fleshner & Kim, LLP

(57) ABSTRACT

An improved thermally tunable system is provided. The improved thermally tunable system includes a thermally tunable apparatus including a first portion and a second portion, a heater configured to thermally tune the apparatus, and a heat sink disposed adjacent to the apparatus, wherein thermal flow is controlled to pass from the heater through the first portion of the apparatus, and then through the second portion into the heat sink, such that a temperature of the second portion remains substantially constant or within a predetermined range. A thermally conductive material is provided between the second portion of the apparatus and the heat sink. A thermally insulating material is provided between the first portion of the apparatus and the heat sink.

24 Claims, 2 Drawing Sheets

THERMALLY TUNABLE SYSTEM

CROSS-REFERENCE TO RELATED APPLICATIONS

The present application claims the benefit of provisional U.S. patent application Ser. No. 60/290,748, filed May 14, 2001. The contents of this provisional application is incorporated herein by reference.

BACKGROUND OF THE INVENTION

1. Field of the Invention

The invention relates to an improved thermally tunable system.

2. Background of the Related Art

A conventional thermally tunable semiconductor laser system is shown in FIG. 1. With a thermally tunable semiconductor laser, the output wavelength of the semiconductor laser can be tuned thermally since the refractive index changes with temperature. The conventional thermally tunable laser system 10 of FIG. 1 includes a semiconductor laser designated by the reference numeral 20. The semiconductor laser 20 includes an active region and a tuning region. In this case, the active region includes a gain section 45. The tuning region includes a phase section 40 and a grating section 35.

The semiconductor laser 20 is positioned on a heat sink 30. A heater 90 is provided, as shown in FIG. 1. The heater 90 provides thermal power for tuning of the phase and grating sections 35 and 40 to a desired wavelength or wavelengths. A layer of oxide 23 separates the heater 90 from electrical contact 21. A contact layer 22 and a cladding layer 24 are provided between the electrical contacts 21 and the various sections 35, 40, and 45 of the device.

In the prior art devices, all sections of the semiconductor laser 20 are tuned by changing the temperature of the heat sink 30. However, at least the following problems arise with the prior art devices.

First, the material used for the gain section is usually highly temperature sensitive. That is, increasing the temperature can reduce the gain dramatically. As a result, the temperature can not be increased too much, and thus the tuning range is very limited.

Second, since the laser chip is very thin, generally only about 100 $\mu$m thick, thermal power injected into the chip is very rapidly transferred to the heat sink. As a result, power utilization is very inefficient. Accordingly, often times the heaters are burned out the heaters are burned out before a reasonably high temperature can be reached.

SUMMARY OF THE INVENTION

An object of the invention is to solve at least the above problems and/or disadvantages and to provide at least the advantages described hereinafter.

The invention provides an improved thermally tunable apparatus that solves at least the above mentioned problems of the prior art.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

The present invention provides a thermally tunable system that is configured so that the temperature of a temperature sensitive portion of the system is held substantially constant at a desired temperature or held within a predetermined temperature range, while another portion of the system is thermally tuned. Further, the thermal flow of the system is designed and controlled so that thermal power is not wasted, but rather directed to the portion of the system to be thermally tuned. Thus, the temperature of the portion of the system that is adapted to be thermally tunable can be widely changed using a small amount of thermal power.

Figure 1:
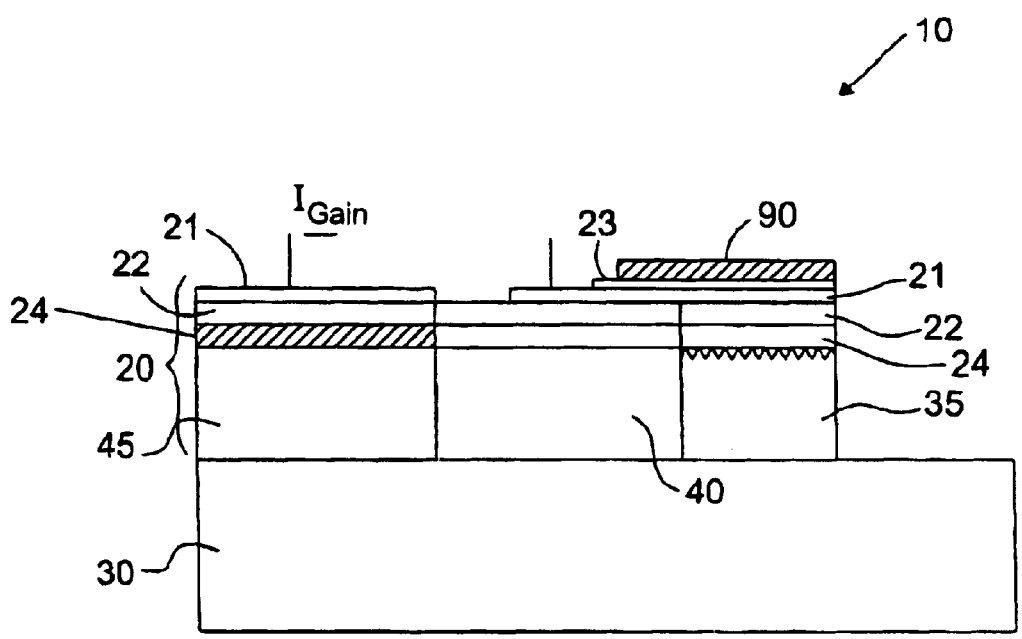
FIG. 1 is a side cross-sectional view of a conventional thermally tunable semiconductor laser system.
Figure 2:
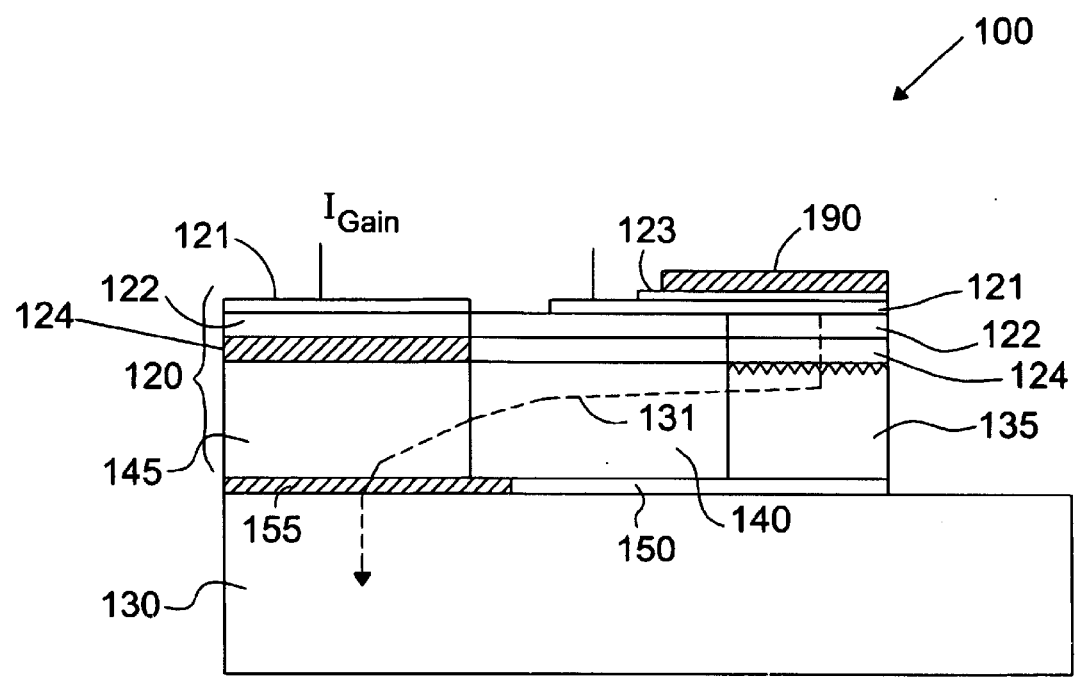
FIG. 2 is a side cross-sectional view of a thermally tunable semiconductor laser system, according to an embodiment of the invention.

FIG. 2 is a cross-sectional side view of a tunable semiconductor laser system 100, according to an embodiment of the invention. Although a tunable semiconductor laser system 100 is shown and described as one application of the present invention, it should be understood that the invention can be applied to non-semiconductor materials, such as polymers, and to other devices, such as tunable filters and tunable receivers. In general, the present invention can be applied to any system in which it is desired to change the temperature of one portion of the system, while maintaining another portion of the system at a substantially constant temperature or within a predetermined temperature range, depending on the application. For example, in the case of a semiconductor laser, the gain provided by the active region is very temperature sensitive. Thus, it is desirable to reduce temperature fluctuations in the active section as much as possible. In other applications, some amount of temperature fluctuation may be tolerable. In any case, the present invention allows for control of thermal flows such that the temperature fluctuations in a portion of the system may be maintained within some tolerable range, while another portion of the system receives sufficient thermal power to tune a thermally adjustable parameter.

For example, the invention can be utilized in any system having an active region or portion and a tuning region or portion by designing and controlling the thermal flow of the system so that the temperature of the active region or portion of the system remains substantially constant or within a predetermined range, while the temperature of the tuning region or portion is changed to tune the system.

In one embodiment of the invention, the system is designed so that a tuning region or portion of the system is isolated from a heat sink by a thermally insulating material positioned between the tuning region or portion and the heat sink. A thermally conductive material is positioned between an active region or portion of the system and the heat sink. With this design, thermal power provided by a heater flows through the tuning region or portion to thermally tune the system. However, the thermal power flows very quickly through the active region into the heat sink, thereby allowing the temperature of the active region to remain substantially constant.

The tunable semiconductor laser system 100 of FIG. 2 includes a semiconductor laser designated by the reference numeral 120. The semiconductor laser 120 is positioned on a heat sink 130. In one preferred embodiment, the temperature of the heat sink is preferably maintained at approximately 20° C.

The semiconductor laser 120 includes an active region or portion and a tuning region or portion. The active region or portion comprises a gain section 145, suitably an InGaAs/InGaAsP multiple quantum well. The tuning region or portion preferably comprises one or more grating sections 135 and a phase section 140. A thin layer of thermally insulating material 150, such as silicon dioxide ($SiO_2$) or any other known thermal insulator, is positioned between the heat sink 130 and the phase and grating sections 140 and 135. A thin layer of thermally conductive material 155 is positioned between the gain section 145 and the heat sink 130.

A heater 190 is provided, as shown in FIG. 2. The heater 190 provides thermal power for thermal tuning of the phase and grating sections 140 and 135 to a desired wavelength or wavelengths. A layer of oxide 123 separates the heater 190 from electrical contacts 121. Electrical contacts 121 are formed on a contact layer 122, and provide electrical current to the semiconductor laser system 100. The contact layer 122 is preferably an InGaAs layer. A P-cladding layer 124, preferably an InP layer, is positioned between the contact layer 122 and the gain, phase and grating sections 145, 140 and 135.

The system is designed such that thermal power flows along a path such as that shown by dashed line 131 from the heater 190 through the grating and phase sections 135 and 140, and then through the gain section 145 and the thermally conductive material 155, and finally into the heat sink 130. Because the gain section 145 is the only section in direct thermal communication with the heat sink 130 via the thermally conductive material 155, heat rapidly flows from the gain section 145 into the heat sink 130. This allows the temperature of the gain section 145 to remain substantially constant while the temperature of the grating and phase sections 135 and 140 is changed, thereby improving thermal power efficiency.

The foregoing embodiments and advantages are merely exemplary and are not to be construed as limiting the invention. The present teaching can be readily applied to other types of apparatuses. The description of the invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A thermally tunable semiconductor device system, comprising:
   a semiconductor device including an active section and tuning section;
   a heater positioned and configured to thermally tune the semiconductor device;
   a heat sink disposed adjacent to the semiconductor device; and
   a thermally conductive material in contact with a lower surface of the active section and the heat sink.

2. The system of claim 1, further comprising:
   a thermally insulating material disposed between the heat sink and the tuning section.

3. The system of claim 1, wherein the active section comprises a gain section.

4. The system of claim 1, wherein the tuning section comprises a phase section and one or more grating sections.

5. The system of claim 1 wherein the semiconductor device comprises a laser.

6. The system of claim 1, wherein the semiconductor device comprises a filter.

7. The system of claim 1, wherein the semiconductor device comprises a receiver.

8. A system, comprising:
   a semiconductor device including an active section and a tuning section;
   a heater positioned and configured to thermally rune the semiconductor device; and
   path which extends from the heater through the tuning section, and then through the active section into a heat sink disposed adjacent to the semiconductor device, wherein the heat sink is positioned so as to draw substantially all of the thermal flow through the active section, such that a temperature of the active section remains substantially constant or within a predetermined range.

9. The system of claim 8, further comprising
   a thermally conductive material disposed between the active section and the heat sink.

10. The system of claim 8, wherein the active section comprises a gain section.

11. The system of claim 8, further comprising:
    a thermally insulating material disposed between the heat sink and the tuning section.

12. The system of claim 11, wherein the tuning section comprises a phase section and one or more grating sections.

13. The system of claim 8, wherein the semiconductor device comprises a laser.

14. The system of claim 8, wherein the semiconductor device comprises a filter.

15. The system of claim 8, wherein the semiconductor device comprises a receiver.

16. A thermally tunable system, comprising:
    a thermally tunable apparatus including an active portion and a tuning portion;
    a heater positioned and configured to thermally tune the apparatus; and
    a thermal flow path which extends from the heater through the tuning portion of the apparatus, and then through the active portion of the apparatus into a heat sink disposed adjacent to the semiconductor device, wherein the heat sink is positioned so as to draw substantially all of the thermal flow out of the thermally tunable apparatus through the active section, such that a temperature of the active portion of the apparatus remains substantially constant or within a predetermined range.

17. The system of claim 16, further comprising:
    a thermally insulating material disposed between the tuning portion and the heat sink.

18. The system of claim 16, wherein the thermally tunable apparatus comprises a semiconductor device.

19. The system of claim 18, wherein the semiconductor device comprises a laser.

20. The system of claim 18, wherein the semiconductor device comprises a filter.

21. The system of claim 18, wherein the semiconductor device comprises a receiver.

22. The system of claim 16, wherein the active portion comprises a gain section, and the tuning portion comprises a phase section and one or more grating sections.

23. The system of claim 22, further comprising:

a thermally insulating material disposed at an interface between the phase and grating sections and the heat sink.

24. A method of tuning a thermally adjustable parameter of a device, the device comprising a tuning portion, and a non-tuning portion in direct thermal communication with the tuning portion, comprising the steps of:

applying heat to the device; and adjusting a thermal flow in the device such that temperature fluctuations in the non-tuning portion are maintained within a predetermined range while the tuning portion receives sufficient thermal power to tune the thermally adjustable parameter.

\* \* \* \* \*